United States Patent
Kagami

(10) Patent No.: US 6,737,878 B2
(45) Date of Patent: May 18, 2004

(54) PROBE APPLIED TO SEMICONDUCTOR PACKAGE TEST AND METHOD FOR TESTING SEMICONDUCTOR PACKAGE

(75) Inventor: Sumio Kagami, Miyazaki (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/303,870

(22) Filed: Nov. 26, 2002

(65) Prior Publication Data

US 2003/0222666 A1 Dec. 4, 2003

(30) Foreign Application Priority Data

May 31, 2002 (JP) .......................................... 2002-158600

(51) Int. Cl.⁷ .............................................. G01R 31/02
(52) U.S. Cl. ...................................... 324/754; 324/761
(58) Field of Search ................................ 324/754, 755, 324/756, 757, 758, 761, 762, 158.1; 439/71, 91

(56) References Cited

U.S. PATENT DOCUMENTS

| | | | | |
|---|---|---|---|---|
| 4,105,970 A | * | 8/1978 | Katz | .......................... 324/761 |
| 5,045,780 A | * | 9/1991 | Swart | .......................... 324/754 |
| 5,557,213 A | * | 9/1996 | Reuter et al. | ................ 324/761 |
| 5,685,725 A | * | 11/1997 | Uratsuji | ........................ 439/71 |
| 6,204,681 B1 | * | 3/2001 | Nagatsuka et al. | .......... 324/761 |
| 6,294,908 B1 | * | 9/2001 | Belmore et al. | .......... 324/158.1 |

FOREIGN PATENT DOCUMENTS

| | | |
|---|---|---|
| JP | 63-101867 | 7/1988 |
| JP | 09-330777 | 12/1997 |
| JP | 10-144438 | 5/1998 |
| JP | 2001-021615 | 1/2001 |

* cited by examiner

Primary Examiner—Kamand Cuneo
Assistant Examiner—Tung X. Nguyen
(74) Attorney, Agent, or Firm—Rabin & Berdo, P.C.

(57) ABSTRACT

A probe used for testing on a semiconductor package is provided which is capable of reducing scratching of a solder ball, sticking of solder to a contact terminal, and damage to the contact terminal. A diameter of an end portion of the contact terminal of a probe is set to be almost the same as that of a solder ball. The end portion is provided with a semispherical concave portion to be contacted with the solder ball and a plurality of guiding grooves formed from a center of the concave portion in a direction of a diameter and used to guide solder separated from the solder ball and stuck to the concave portion.

7 Claims, 8 Drawing Sheets

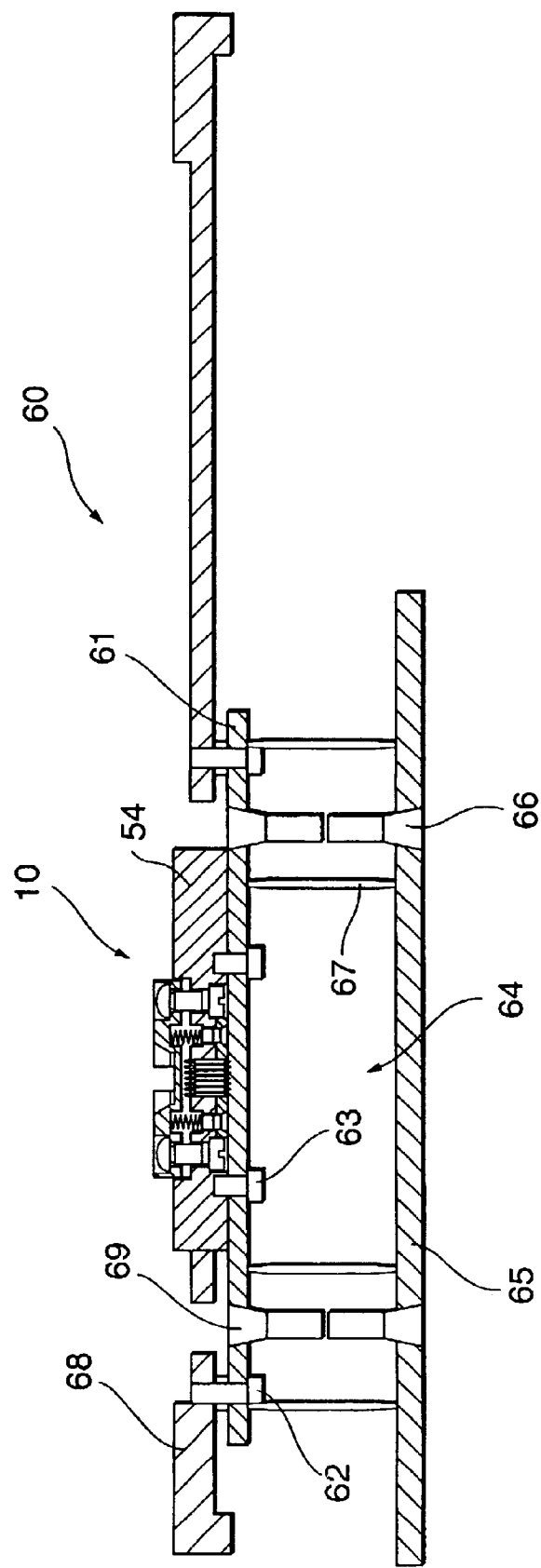

PROBE APPLIED TO SEMICONDUCTOR PACKAGE TEST AND METHOD FOR TESTING SEMICONDUCTOR PACKAGE

BACKGROUND OF THE INVENTION

1. Field of the Invention

The present invention relates to a probe of a semiconductor socket, which is applied during a semiconductor package test to test an electrical characteristic of an integrated circuit in a semiconductor package called, for example, BGA (Ball Grid Array).

2. Description of the Related Art

In a semiconductor package, a semiconductor chip on which semiconductor integrated circuits are formed is packaged through a package sealing process using, for example, a resin. As one of the semiconductor packages formed by the way described above, a BGA package 1 shown in FIGS. 6(*a*) and 6(*b*) is known. On a bottom surface of the BGA package 1 are placed solder balls 2 serving as an input/output terminal from or to an outside and which are arranged in a grid form.

In order to carry out a test on semiconductor integrated circuits mounted in the BGA package 1 to check their electric characteristics, a semiconductor socket 4 in which a plurality of probes 3 are mounted, is provided as shown in FIG. 7. That is, at a time of making the test, by mounting the BGA package 1 on the semiconductor socket 4, the solder balls 2 come into contact with contact terminals 5 placed on the probe 3. Since the contact terminals 5 are provided with elasticity by a compressed spring (not shown) being placed in a lower portion, an effective contact between the solder ball 2 and the contact terminal 5 can be obtained.

However, each of the contact terminals 5 placed on the conventional probes 3 has a tip portion 6 as shown in FIG. 8. The end portion 6 is configured in a manner that it has four projected portions each having a crest. Therefore, since the conventional probe 3 comes into contact with the solder ball 2 at four points, the solder ball 2 is scratched. As a result, if the BGA package 1 is mounted on a print substrate after the test has been completed, there is a risk of occurrence of a junction failure. Thus, the conventional probe 3 has a disadvantage in that an increase in defective rate of the semiconductor package is unavoidable.

Moreover, if the four crests on the end portion 6 come into point-contact with the solder ball 2, pushing force is concentrated in the point-contact position of the solder ball 2. Therefore, solder separated from the solder ball 2 easily sticks to the end portion 6 and, due to oxidization of the stuck solder, a rate of occurrence of contact failures becomes high. On the other hand, the end portion 6 of each of the contact terminals 5 is crushed in a short time and becomes unusable and a frequency of replacing the contact terminal 5 becomes high. The above problems occur often when the solder ball 2 is formed using a Pb (lead)- free solder.

SUMMARY OF THE INVENTION

In view of the above, it is an object of the present invention to provide a probe for testing on a semiconductor package which is capable of reducing scratching on a solder ball, sticking of solder to a contact terminal, and damage to the contact terminal.

According to a first aspect of the present invention, there is provided a probe applied to semiconductor package test which is to test an electrical characteristic of an integrated circuit in a semiconductor package, having:

a contact terminal to contact electrically a solder ball serving as a contact of the semiconductor package;

wherein the end portion of the contact terminal is provided with: a concave portion which is to come into contact with the solder ball and has a concave showing almost hemispherical shape; and at least a guiding groove to guide adherent solder adhering to the concave portion from the solder ball to outside, which is formed on the concave portion and extends from the bottom center of the concave portion toward outside.

With the above configuration, the contact terminal employed in the probe for testing a semiconductor package has almost semispherical concave to be in contact with the solder ball in the semiconductor package and a guiding groove being formed from a center of the concave portion in a direction of a diameter and operated to guide solder adhering to the concave portion. As a result, since the solder ball comes into contact with the contact terminal not in a point contact form but in at least a line contact form, an amount of solder adhering to the concave portion can be reduced. Thus, the scratch on the solder ball and the damage to the contact terminal can be minimized. Therefore, a junction failure of the semiconductor package occurring when the semiconductor package is mounted and additionally a life expectancy of the probe can be lengthened. Moreover, since the solder separated from the solder ball and adhering to the concave portion flows out along the guiding groove from a center of the concave to an outside of the contact terminal, a long washing period to be used for removing the solder can be secured. Therefore, an operation rate of the test apparatus can be improved.

In the probe, the contact terminal may be made up of a cylindrical body having said end portion and having a diameter being slightly smaller than that of said solder ball.

In this case, by making a diameter of the contact terminal slightly smaller than the solder ball, pushing pressure is not concentrated in a point contact position of the solder ball but is dispersed in a face surrounding the solder ball and therefore an amount of solder separated from the solder ball and adhering to the contact terminal can be further reduced.

According to a second aspect of the present invention, there is provided a method for testing an electrical characteristic of an integrated circuit in a semiconductor package, for making a solder ball serving as contact of the semiconductor package contact electrically a probe putted in a test semiconductor socket, comprising:

placing the solder ball into a concave showing almost hemispherical shape of a concave portion formed on a contact terminal of the probe;

making the solder ball contact the concave portion;

guiding adherent solder adhering to the concave portion from the solder ball to outside by at least a guiding groove formed on the concave portion.

BRIEF DESCRIPTION OF THE DRAWINGS

The above and other objects, advantages and features of the present invention will be more apparent from the following description taken in conjunction with the accompanying drawings in which:

FIG. 5 is a cross-sectional view illustrating a socket holder of the present invention;

DESCRIPTION OF THE PREFERRED EMBODIMENTS

Best modes of carrying out the present invention will be described in further detail using various embodiments with reference to the accompanying drawings.

Embodiment

Figure 1A:
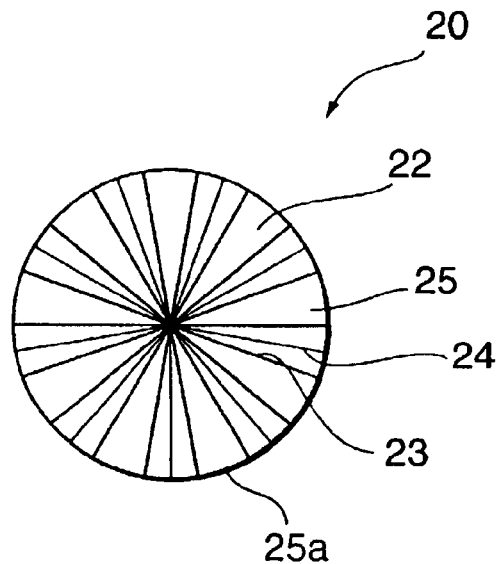
FIG. 1 is a diagram illustrating a contact terminal being placed on a probe of the present invention and FIG. 1(*a*) is a top view of the contact terminal and FIG. 1(*b*) is a front view of the contact terminal.
Figure 1B:
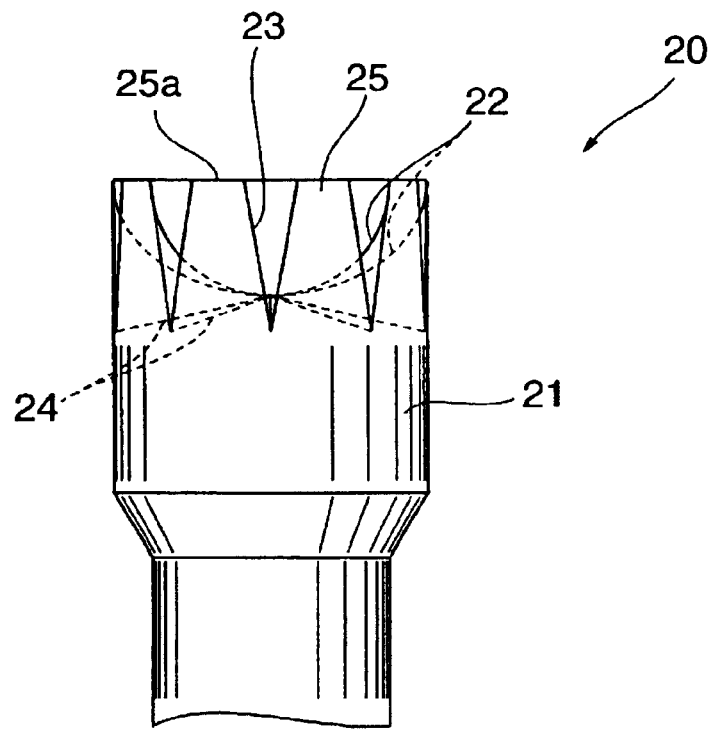

FIG. 1 is a diagram illustrating a contact terminal being placed on a probe of the present invention. FIG. 1(a) is a top view of the contact terminal and FIG. 1(b) is a front view of the contact terminal. Prior to descriptions of configurations shown in FIG. 1, a semiconductor socket is described in which a semiconductor package is mounted and a probe is placed.

Figure 3:
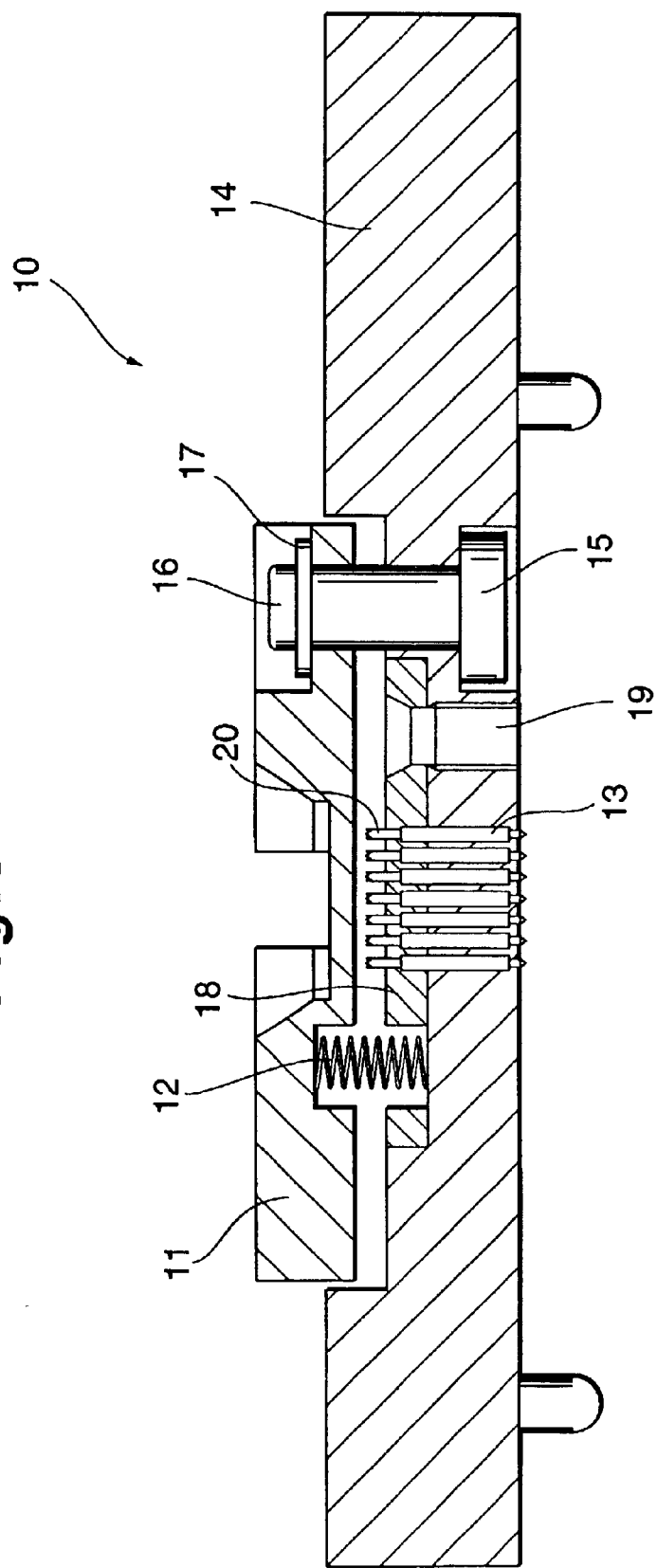
FIG. 3 is a cross-sectional view illustrating a semiconductor socket of the present invention.
Figure 4:
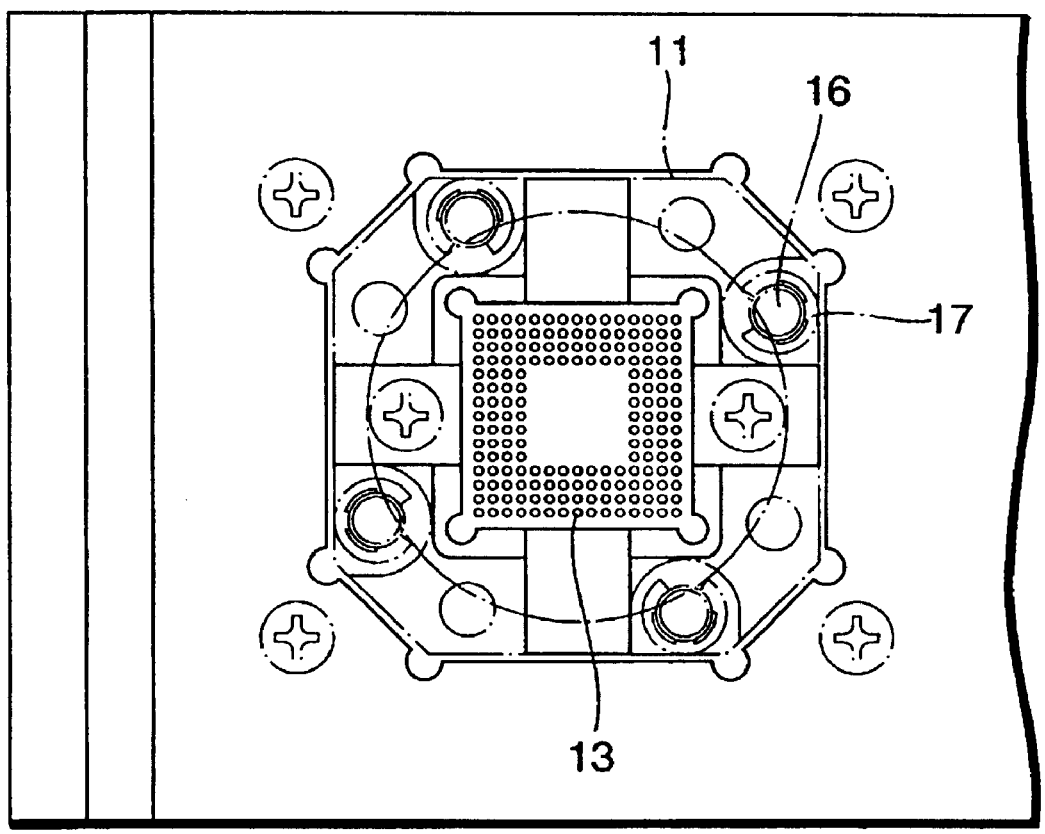
FIG. 4 is a top view showing the semiconductor socket of the present invention.
Figure 6A:
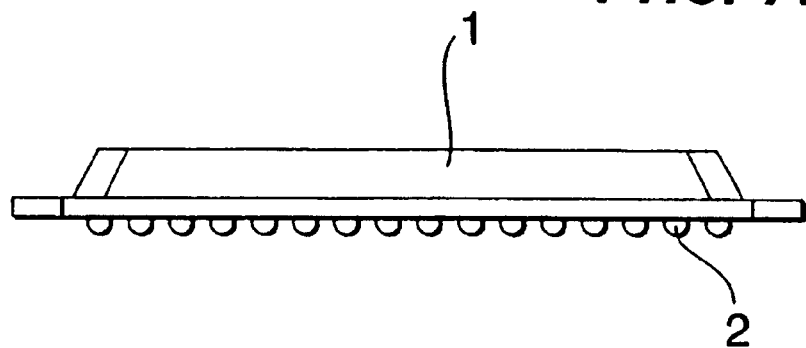
FIG. 6 is a cross-sectional view illustrating a BGA package.
Figure 6B:
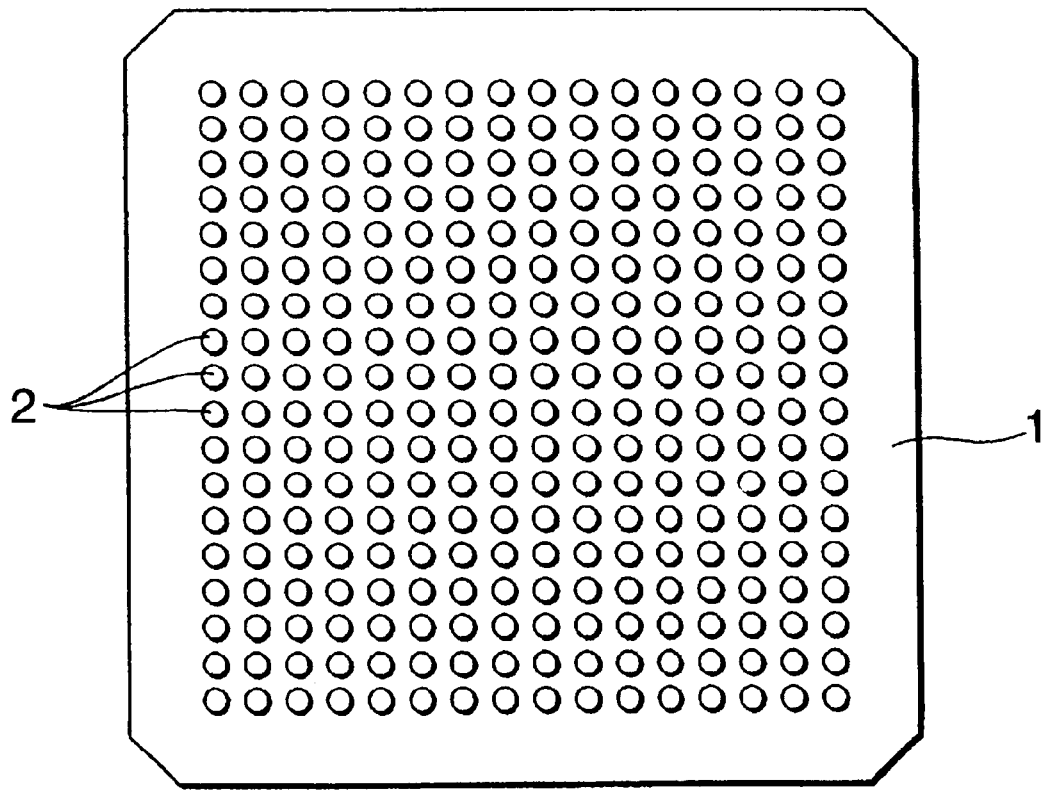
Figure 7:
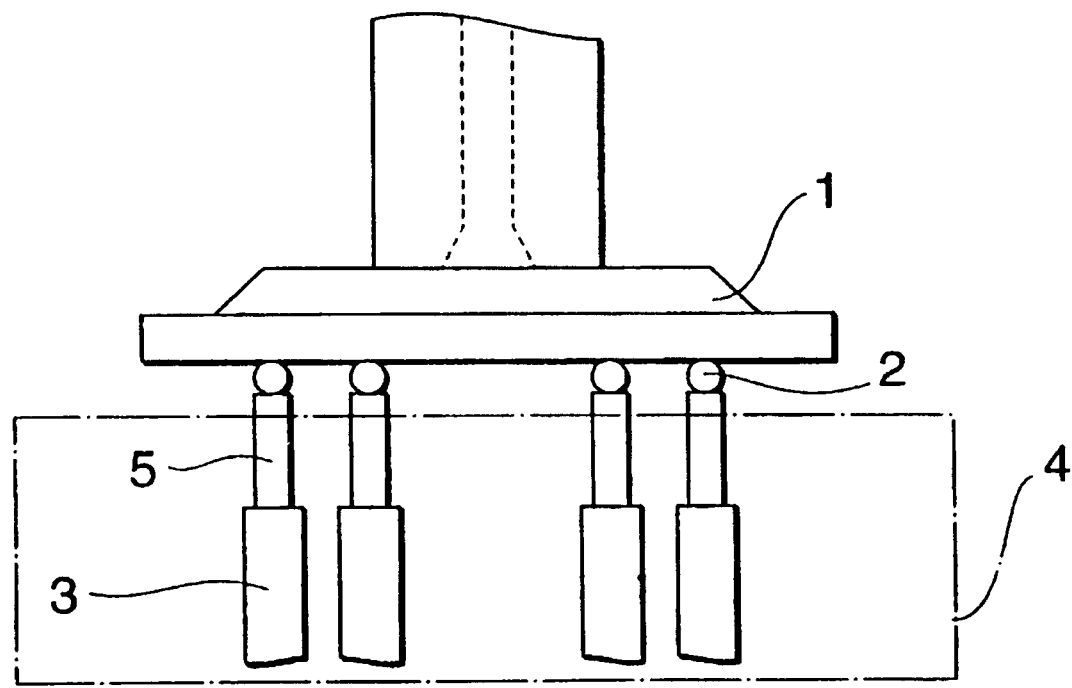
FIG. 7 is a front view illustrating a BGA package mounted on a semiconductor socket.
Figure 8:
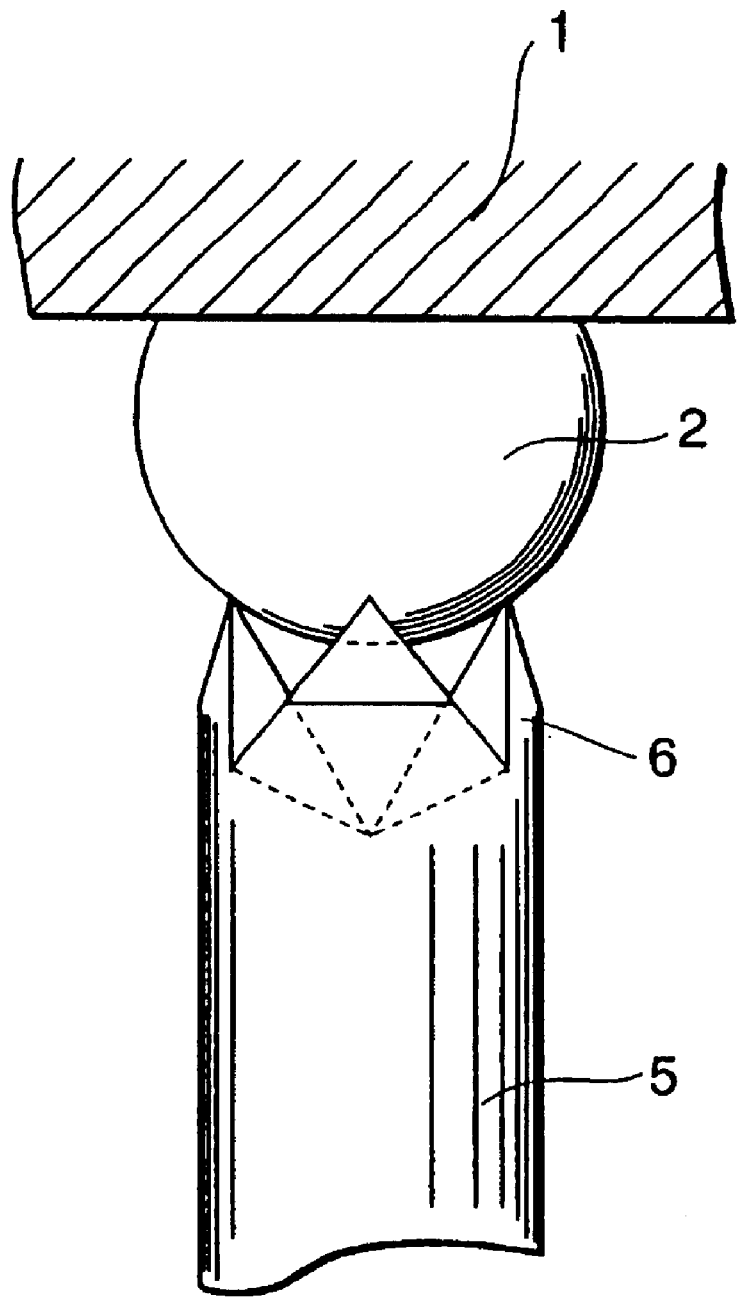
FIG. 8 is a front view showing a conventional contact terminal.

FIG. 3 is a cross-sectional view illustrating a semiconductor socket of the present invention. FIG. 4 is a top view showing the semiconductor socket of the present invention. FIG. 5 is a cross-sectional view illustrating a socket holder of the present invention. The semiconductor socket 10 shown in FIG. 3 is provided with a stage 11 used to position the semiconductor device (package) having a plurality of solder balls. Each solder ball serves as an input and output terminal from or to an outside. At a bottom surface along a tapering hole, probes 13 are provided. Each probe has a contact terminal 20 which comes into contact with each of the solder balls of the positioned semiconductor device when the stage 11 comes near against an elasticity of a spring 12 as an elastic body. A socket base 14 houses the probes 13 in a manner that allows it to be inserted and withdrawn on a side of a surface opposite to the stage 11.

Moreover, the semiconductor socket 10 is provided with a guide pin 15 extruding from the opposite surface of the socket base 14 and passing through the stage 11. The guide pin is adapted to guide the stage 11 toward and away from the probe 13. An E ring 17 is mounted on the guide pin so as to be attachable and detachable in a concave groove 16 formed at a specific place at an end portion of the guide pin 15 having passed through the stage 11. A cap 18 serves as a pull-out preventing portion used to prevent the probes 13 housed in the socket base 14 from being pulled out. A flat-head screw 19 is used to fix the cap 18 to the socket base 14 without interfering with the stage 11 coming down.

The stage 11 in which the semiconductor device is held is guided in up and down directions along the guide pin 15. Moreover, as shown in the top view of FIG. 4, on a side of a surface of the stage 11 is formed a concave portion being opened at an end face of the stage. An end of the guide pin 15 is positioned in the concave portion. Moreover, the stage 11 always keeps a specific distance relative to the socket base 14 by using the spring 12 placed between the stage 11 and the socket base 14, unless a pushing pressure is applied to the stage 11 from an outside.

The semiconductor socket 10 of the present invention, as shown in FIG. 5, is mounted and fixed in a specific position on a socket mounting substrate 61 making up the socket holder 60. A socket holder 60 embedded in the semiconductor socket 10 of the present invention is set to an automatic machine of the semiconductor testing apparatus.

Next, a method for replacing the probe 13 required when damage occurs on the probe 13 in the semiconductor socket 10 is described. First, the socket holder 60 is taken out from an automatic machine of a semiconductor testing apparatus. Then, the E ring 17 disposed in a concave portion in the stage 11 is taken out without taking out the semiconductor socket 10 from the socket holder 60, and then the stage 11 is taken out. At the same time the spring 12 is also taken out.

Next, the flat-head screw 19 is taken out and then the cap 18 is taken out. Then, the probe 13 to be replaced is taken out by using a pincette and a new probe 13 is inserted. After the replacement of the probe 13, the semiconductor socket 10 of the present invention is combined in a retrograde order and then the socket holder 60 is set to a predetermined position for the automatic machine.

Since, in the above semiconductor socket 10, the probe 13 can be replaced without taking out the semiconductor socket 10 from the socket holder 60, processes of disassembling and assembling the socket holder 60 in which a plurality of components is combined using screws can be reduced and time required for replacing the probe 13 can be shortened.

Moreover, as described above, since processes of disassembling and assembling of the socket holder 60 are not required, occurrence of electrical connection failure that may be caused by assembling following disassembling among a connecting pin 67, a socket mounting substrate 61, a connecting pin 67, a DUT board 65, a probe 13, and a socket mounting substrate 61 can be reduced.

Moreover, by using the above semiconductor socket 10 for the semiconductor testing apparatus, when a failure occurs in the probe 13, since the defective probe can be replaced in a short time, an operation rate of the semiconductor testing apparatus can be improved.

Next, by referring to FIG. 1, configurations of the contact terminal 20 mounted on the replaceable probe 13 will be described. The contact terminal 20 of the present invention is formed using a circularly cylindrical body having almost the same diameter as that of the solder ball and, as shown in FIG. 1(a) and FIG. 1(b), is provided with an end portion 21. The end portion 21 is provided with an almost hemispherical concave portion 22 being opened upward and nine guiding grooves 23 being formed on the bottom of the concave portion 22 in a radial manner. Each of the guiding grooves 23, as shown in FIG. 1, is made up of a notch whose cross section is triangular and has a culling line 24 being tilted (sloped) downward from a center of the concave portion 22. Therefore, between adjacent guiding grooves are formed extruding portions 25, each having an approximately triangle shape when seen from a top face. In the embodiment, when seen using the top view shown in FIG. 1(a), each of the guiding grooves 23 and the extruding portions 25 has an angle forming a circular arc being 20°. That is, each of the extruding portions 25 has a circular arc end 25a being 20°.

Figure 2A:
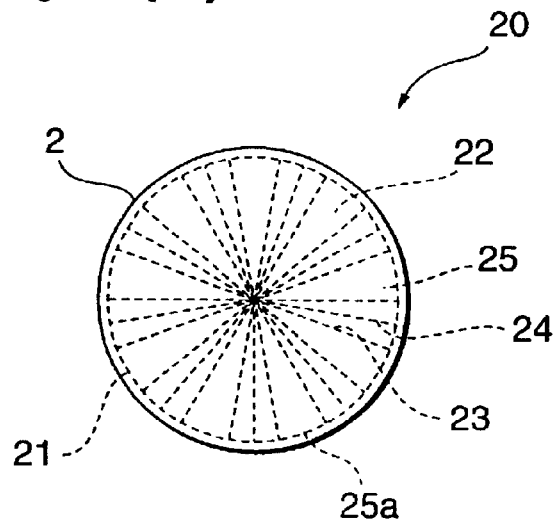
FIG. 2(*a*) is a top view and FIG. 2 (*b*) is a front view, showing a state of contact between a solder ball and the contact terminal at a time when a test is carried out on a semiconductor according to the present invention.
Figure 2B:
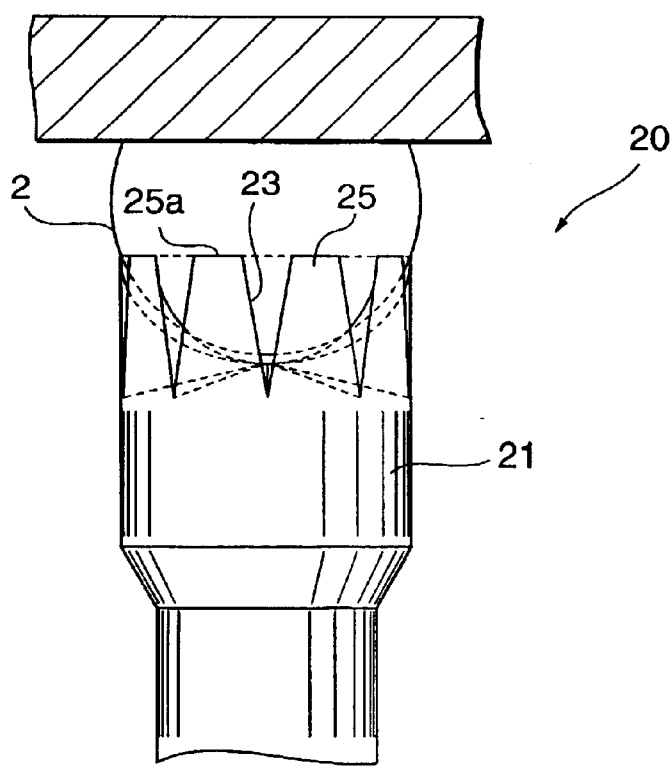

FIG. 2 shows a state of contact between the solder ball and the contact terminal at a time when a test is carried out on a semiconductor. FIG. 2(a) is a top view and FIG. 2(b) is a front view. The solder ball 2 of the semiconductor package 1 is made of a Pb-free solder and, as shown in FIG. 2, is placed in the concave portion 22 of the end portion 21 of the contact terminal 20 in a state being pushed with pressure. In the embodiment, if a diameter of the solder ball 2 is almost 0.42 mm, a diameter of the tip portion 21 is set to be almost 0.4 mm, which is a bit smaller than that of the solder ball 2, and a radius of the concave portion 22 is 0.2 mm.

As shown in FIG. 2, the solder ball 2 is in contact with, at least, the circular arc end 25a of each of the extruding portions 25. As a result, contact between the solder ball 2 and the contact terminal 20 is made in a manner of, at least, a line contact. Therefore, scratching on the solder ball is reduced and damage such as crushing of the contact terminal can be prevented.

Moreover, a bottom of the guiding groove 23, that is, the cutting line 24, is tilted downward so that it extends toward a face surrounding the end portion 21 from a center of the concave portion 22. This prevents a solder that is separated from the solder ball 2 and adhering to the extruding portion 25 from being dropped in to the guiding groove 23, and the solder is guided to an outside of the contact terminal 20 along the guiding groove 23 to be ejected. Therefore, an amount of the solder stuck to an end of the contact terminal 20 can be reduced and an increase in contact resistance caused by repeated testing on the contact terminal 20 can be inhibited. Thus, the testing can be carried out consecutively in the same number of times as employed in the case where the solder ball 2 is made of an eutectic solder. That is, a washing period of the contact terminal 20 can be extended by 2 times to 5 times compared with the conventional case.

Moreover, as shown in FIG. 2, the contact terminal 20 has almost the same diameter as that of the solder ball 2. As a result, a semispherical portion in the lower portion of the solder ball 2 is inserted into the concave portion 22 and the semispherical portion is pressed with pressure by a whole concave portion 22. Therefore, the amount of solder separated from the solder ball 2 and stuck to the contact terminal 20 can be further reduce.

It is thus apparent that the present invention is not limited to the above embodiments but may be changed and modified without departing from the scope and spirit of the invention.

Moreover, to bring the all above contents to a conclusion, effects of the present invention are described below.

According to the probe for testing on the semiconductor package of the present invention, since contact between the solder ball and the contact terminal is made at least in a line contact manner, an amount of adherent solder is reduced. Thus, scratching of the solder ball and damage to the contact terminal due to the adherent solder can be reduced. Moreover, since solder separated from the solder ball can be ejected from a bottom center of a concave of a concave portion to outside of the contact terminal, along the guiding groove, the increase of contact resistance of the contact terminal caused by repeated testing can be inhibited.

What is claimed is:

1. A probe applied to a semiconductor package test which is utilized to test an electrical characteristic of an integrated circuit in a semiconductor package, including:

a contact terminal adapted to electrically contact a solder ball that serves as a contact of the semiconductor package, and including an end, and a concave portion formed at the end, the concave portion being adapted to contact the solder ball, the contact terminal further having a plurality of radially disposed guiding grooves arranged at a bottom of said concave portion, each guiding groove being sloped downward from a bottom center of said concave portion to an outermost side of said concave portion, to guide adherent solder from inside of said concave portion to outside of said concave portion.

2. The probe according to claim 1, wherein said contact terminal is made up of a cylindrical body having said concave portion and having a diameter being slightly smaller than that of said solder ball.

3. The probe according to claim 1, wherein said concave portion is divided into a plurality of extruding portions, with each extruding portion being separated from an adjacent extruding portion by a space, and with each guiding groove terminating at a respective space, each extruding portion having an uppermost edge that has an arcuate, flat shape, wherein the uppermost edges of said extruding portions contact the solder ball in a line contact.

4. The probe according to claim 1, wherein said concave portion has essentially a hemispherical shape.

5. A method for testing an electrical characteristic of an integrated circuit in a semiconductor package having a solder ball serving as a contact comprising:

providing a contact terminal having an end, a concave portion formed at the end, and a plurality of radially disposed guiding grooves arranged at a bottom of the concave portion, each guiding groove being sloped downward from a bottom center of the concave portion to an outermost side of the concave portion;

placing the solder ball into the concave portion;

electrically contacting the solder ball with the concave portion; and guiding adherent solder from inside of the concave portion to outside of the concave portion using the guiding grooves.

6. The method according to claim 5, wherein the concave portion is divided into a plurality of extruding portions, with each extruding portion being separated from an adjacent extruding portion by a space, and with each guiding groove terminating at a respective space, each extruding portion having an uppermost edge that has an arcuate, flat shape, wherein the uppermost edges of the extruding portions contact the solder ball in a line contact.

7. The method according to claim 5, wherein the concave portion has essentially a hemispherical shape.

* * * * *